(12) United States Patent
Tzeng et al.

(10) Patent No.: US 6,660,624 B2
(45) Date of Patent: Dec. 9, 2003

(54) METHOD FOR REDUCING FLUORINE INDUCED DEFECTS ON A BONDING PAD SURFACE

(75) Inventors: Jiann-Tyng Tzeng, Yi-Lan (TW); Jih-Ren Tsai, Hsin-Chu (TW); Michael Wu, Kaohsiung (TW); Ching-Wen Cho, Industrial Pk. (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/076,891

(22) Filed: Feb. 14, 2002

(65) Prior Publication Data

US 2003/0153196 A1 Aug. 14, 2003

(51) Int. Cl.⁷ .............................................. H01L 21/44
(52) U.S. Cl. ........................ 438/612; 438/637; 438/660; 438/687; 438/688; 438/712; 438/715; 438/722; 438/723; 438/724; 438/725; 438/726; 438/473; 438/474; 438/475
(58) Field of Search ................................. 438/612, 637, 438/660, 687, 688, 712, 715, 722, 723, 724, 725, 726, 473–475

(56) References Cited

U.S. PATENT DOCUMENTS

| | | | | |
|---|---|---|---|---|
| 6,362,531 B1 | * | 3/2002 | Stamper et al. ............. | 438/637 |
| 6,376,384 B1 | * | 4/2002 | Yen et al. .................... | 438/724 |
| 6,420,254 B1 | * | 7/2002 | Stamper et al. ............. | 438/612 |
| 6,440,863 B1 | * | 8/2002 | Tsai et al. .................... | 438/723 |
| 2002/0177301 A1 | * | 11/2002 | Biolsi et al. ................. | 438/637 |

* cited by examiner

Primary Examiner—John F. Niebling
Assistant Examiner—Lynne A. Gurley
(74) Attorney, Agent, or Firm—Tung & Associates

(57) ABSTRACT

A method for reducing a fluorine contamination level on a semiconductor wafer process surface including providing a semiconductor wafer surface having a process surface including an uppermost polyimide containing layer; reactive ion etching the process surface to include exposure of the process surface to a hydrofluorocarbon containing plasma; and heating the process surface according to a temperature profile to reduce a fluorine contamination level.

20 Claims, 2 Drawing Sheets

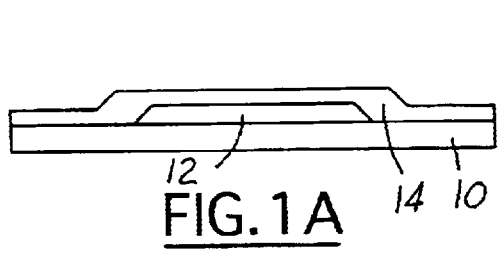
FIG. 1A
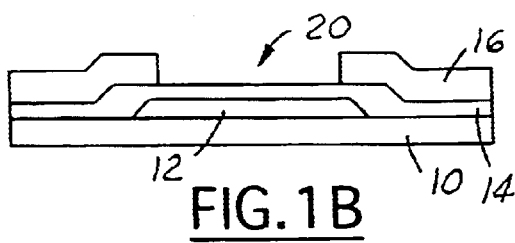
FIG. 1B
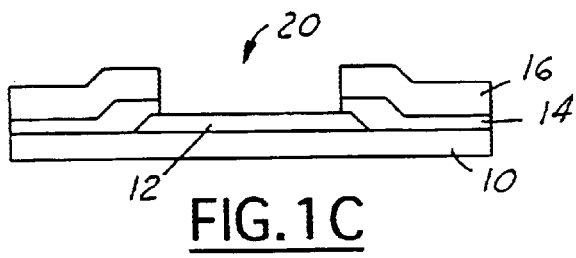
FIG. 1C
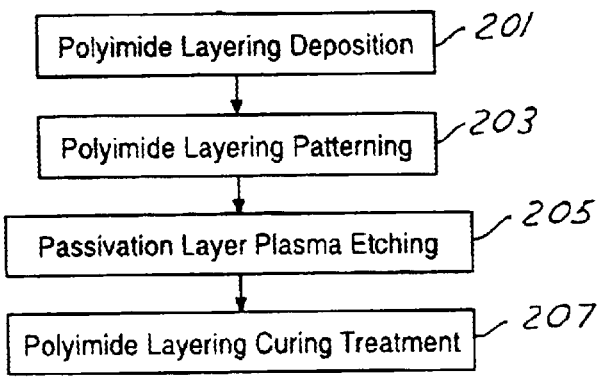
FIG. 2
TABLE A
| Take Off Angle | F% | O% | N% | C% | S% | Si% |
|---|---|---|---|---|---|---|
| 0 | 24.98 | 12.8 | 1.83 | 53.09 | 4.41 | 2.1 |
| 60 | 30.1 | 10.3 | 1.33 | 52.7 | 4.27 | 1.2 |
FIG. 3A *Prior Art*
TABLE B
| Take Off Angle | F% | O% | N% | C% | S% | Si% |
|---|---|---|---|---|---|---|
| 0 | 17.9 | 16.1 | 1.79 | 56 | 3.7 | 3.3 |
| 60 | 25.6 | 12.2 | 1.6 | 54.2 | 4.67 | 1.3 |
FIG. 3B

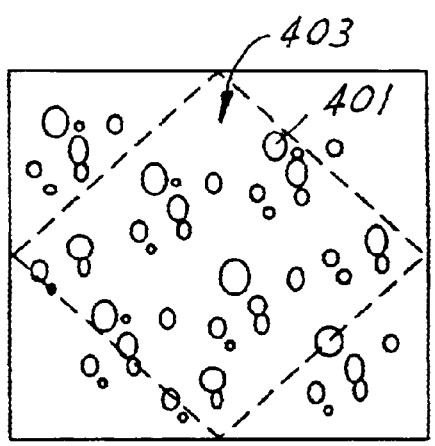 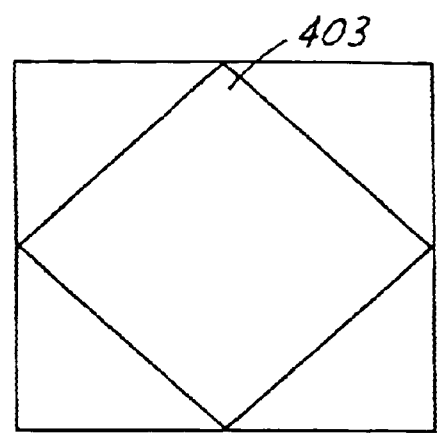
FIG.4A
*Prior Art*
FIG.4B

METHOD FOR REDUCING FLUORINE INDUCED DEFECTS ON A BONDING PAD SURFACE

FIELD OF THE INVENTION

This invention generally relates to methods for reducing corrosive contamination on semiconductor surfaces and more particularly to reducing fluorine contamination induced defects on bonding pad surfaces.

BACKGROUND OF THE INVENTION

In semiconductor fabrication, various layers of insulating material, semiconducting material and conducting material are formed to produce a multilayer semiconductor device. The layers are patterned to create features that taken together, form elements such as transistors, capacitors, and resistors. These elements are then interconnected to achieve a desired electrical function, thereby producing an integrated circuit (IC) device. The formation and patterning of the various device layers are achieved using conventional fabrication techniques, such as oxidation, implantation, deposition, epitaxial growth of silicon, lithography, etching, and planarization.

In a typical multilayer semiconductor device the uppermost layers which are electrically interconnected with underlying layers by way of, for example, vias, additionally include bonding pads for forming electrical connection with the semiconductor device (chip) surface to a package which contains the chip. The bonding pads are typically formed in an array on the semiconductor wafer surface which similarly includes an array of devices or chips.

Prior to cutting the semiconductor wafer into the various constituent chips, the semiconductor wafer surface including the bonding pads are covered with one or more passivation layers to insulate conducting areas and to physically protect the chip surface. Dielectrics, for example making various layers of the semiconductor device, are adversely affected by moisture. For example, some of the adverse affects include, reduction of bulk resistivity, electrical polarization effects, hot electron effects, and slow trapping degradation. Dielectric materials are also affected mechanically in that they tend to expand and exert compressive stresses as they absorb moisture. Dielectric materials may also be chemically attacked by moisture, for example when doped with boron and phosphorus. Formation of boric and phosphoric acids can result and initiate corrosion of surrounding interconnect materials.

In order to prevent moisture build-up and penetration in the device, one or more passivation layers are formed on the surface of the device. The passivation layer is typically patterned to form openings over the bonding pads to which bond wires are subsequently connected. The passivation layer also protects the semiconductor surface from conductive particles and scratches causing, for example, shorts of conductive interconnects at the device surface.

In a typical method for applying a passivation layer, a first passivation layer is typically formed by chemical vapor deposition (CVD), for example by PECVD (plasma enhanced CVD) forming a blanket layer over the process wafer surface including the bonding pads, for example copper or aluminum. The first passivation layer, for example is a dielectric such as silicon nitride (e.g. $Si_3N_4$, $Si_XNi_Y$, $H_Z$,) forming a layer typically 7000–12000 Angstroms thick over the underlying metallic bonding pads, which are typically 4000–8000 Angstroms in thickness.

Following deposition of the first passivation layer, another dielectric passivation layer may optionally be applied. Following the application of dielectric passivation layers, a layer of photoresist is deposited to photolithographically pattern the dielectric passivation layers for reactive ion etching to expose an area overlying the bonding pads. The photoresist layer forms an overlying, thicker passivation layer, for example, a photosensitive polyimide, providing additional insulation and physical protection for the semiconductor device. Recently, it has been the practice to leave the photoresist layer, for example a photosensitive polyimide, as a second passivation layer on the process wafer surface after patterning and etching an opening through the first passivation layer over the bonding pads. A polyimide resin is excellent in electrical and mechanical characteristics, including high heat resistance and is advantageously used as a surface-protecting and insulation layer for a semiconductor device. Following formation of the passivation layers, the semiconductor wafer is tested, diced into individual chips, the chips mounted in chip carrier packages and the bond pads electrically connected to the chip carrier package.

One problem in the prior art method of passivation layer application and patterning, and reactively ion etching to expose the bonding pad surface is fluorine contamination from the reactive ion etching process. For example hydrofluorocarbon containing plasmas are routinely used to etch metal nitrides, including a silicon nitride passivation layer overlying a bonding pad surface. The issue of fluorine contamination is particularly problematic with aluminum bonding pads where over time, for example after period of storage of the chips in plastic boxes, the fluorine contamination on a wafer may tend to segregate out to corrode the bonding pad surface or to form fluorinated aluminum crystallites on the bonding pad surface. As a result, bonding to the bonding pad surfaces exhibit a high rate of failure due to reduced adhesion of the wire bond to the bonding pad surface.

The use of the polyimide photoresist as an uppermost passivation layer tends to exacerbate the problem of fluorine contamination since it readily collects fluorine contamination.

Therefore, there is a need in the semiconductor art to develop a process whereby fluorine contamination remaining following a reactive ion etching process is removed from a semiconductor wafer surface such that long term effects including segregation onto bonding pad surfaces is avoided thereby increasing a yield of packaged semiconductor chips.

It is therefore an object of the invention to provide a process whereby fluorine contamination remaining following a reactive ion etching process is removed from a semiconductor wafer surface such that long term effects including segregation onto bonding pad surfaces is avoided thereby increasing a yield of packaged semiconductor chips while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for reducing a fluorine contamination level on a semiconductor wafer process surface.

In one embodiment of the present invention, the method includes providing a semiconductor wafer surface having a process surface including an uppermost polyimide containing layer; reactive ion etching the process surface to include exposure of the process surface to a hydrofluorocarbon containing plasma; and, heating the process surface according to a temperature profile to reduce a fluorine contamination level.

In related embodiments the temperature profile includes a temperature of from about 200 degrees Centigrade to about 350 degrees Centigrade. Further, the temperature profile includes heating time periods of from about 1 hour to about 6 hours. Further yet, the temperature profile includes at least one of a temperature heating rate and a temperature soaking time.

In another embodiment, the step of heating is carried out under controlled ambient conditions.

In other embodiments the polyimide containing layer comprises a photosensitive passivation layer overlying bonding pad surfaces. Further, the polyimide containing layer is photolithographically patterned and developed to reveal an underlying passivation layer prior to the step of reactive ion etching. Further yet, the step of reactive ion etching further includes etching through at least one underlying passivation layer to reveal bonding pad surfaces.

In another embodiment, the bonding pad surfaces include one of aluminum and copper.

In yet another embodiment, the method further comprises the step of storing the semiconductor wafer under controlled ambient conditions.

These and other embodiments, aspects and features of the invention will be better understood from a detailed description of the preferred embodiments of the invention which are further described below in conjunction with the accompanying Figures.

BRIEF DESCRIPTION OF THE DRAWINGS

FIGS. 1A–1C are side view representations of a portion of a semiconductor wafer showing a portion of a semiconductor device at a stage in a manufacturing process reflecting an exemplary embodiment according to the present invention.

FIG. 2 is a process flow diagram according to one embodiment of the present invention.

FIGS. 3A and 3B are Tables of surface chemical concentrations including fluorine of a semiconductor wafer surface comparing the process according to the present invention to the prior art.

FIGS. 4A and 4B are graphical top view representations of bonding pad surfaces following a storage period comparing the process according to the present invention to the prior art.

DETAILED DESCRIPTION OF THE PREFERRED EMBODIMENTS

Although the method of the present invention is explained with specific reference to eliminating fluorine contamination from bonding pad surfaces, the method of the present invention may be advantageously used in conjunction with any process where it would be advantageous to reduce fluorine contamination to a level whereby segregation onto metal surfaces over an extended time period is advantageously be avoided.

In an exemplary embodiment applying the method of the present invention in conjunction with a semiconductor wafer formation process, referring to FIG. 1A, is shown a cross section of a portion of a semiconductor wafer at a stage in a manufacturing process including a first passivation layer 14 is deposited by chemical vapor deposition (CVD), for example by PECVD (plasma enhanced CVD) forming a blanket layer over the process wafer surface including bonding pad 12 and substrate 10. Substrate 10, for example is an insulating dielectric layer formed of a low dielectric constant oxide such as, for example, a porous silicon oxide. The passivation layer 14 may be formed by a variety of deposition methods including, for example, atmospheric pressure chemical vapor deposition (APCVD), low pressure chemical vapor deposition (LPCVD), laser assisted chemical vapor deposition, LACVD, photo assisted chemical vapor deposition (PACVD), or electron cyclotron resonance chemical vapor deposition (ECRCVD).

The passivation layer 14 is preferably a metal nitride, for example silicon nitride (e.g., $Si_3N_4$, $Si_xNi_y$, $H_z$,). The passivation layer 14 may also include silicon oxynitride or silicon oxide, which can be alloyed with phosphorus or other metallic elements.

The passivation layer 14 is typically 7000–12000 Angstroms thick and follows the topography of the underlying metallic bonding pads e.g., 12, for example aluminum or copper, which is typically 4000–8000 Angstroms in thickness. Optionally, more than one passivation layer may be deposited (not shown) over the substrate 10 and bonding pads e.g., 12.

Turning briefly to FIG. 2, a process flow diagram shows one embodiment of the present invention where following deposition of passivation layer 14, a layer of photoresist material, preferably a photosensitive polyimide containing material is deposited to form layer 16 according to process 201 and photolithographically patterned according to process 203 and as shown in FIG. 1B to define an opening 20 overlying bonding pad 12 for reactive ion etching of passivation layer 14 according to process 205. The polyimide containing layer 16 forms a second, thicker passivation layer providing additional insulation and physical protection for the semiconductor device.

Following deposition of the photosensitive polyimide containing layer 16 according to process 201, a conventional photolithographic patterning and developing process is undertaken according to process 203 to define the passivation layer 14 for reactive ion etching according to process 205 and as shown in FIG. 1B. Opening 20, for example defines a pattern for reactive ion etching through passivation layer 14 to expose underlying bonding pad 12 for subsequent bonding processes. The polyimide containing layer with opening 20 exposing passivation layer 14 is then subjected to a reactive ion etching process 205 where a plasma is formed from a mixture of hydrofluorocarbons, for example $CF_4$, and oxygen ($O_2$) whereby the passivation layer 14, for example, silicon nitride, is over-etched to expose bonding pad layer 12 as shown in FIG. 1C.

According to the method of the present invention, following reactive ion etching of the passivation layer 14 according to process 205, the semiconductor wafer is subjected to a curing treatment at elevated temperature for a period of time according to process 207 to reduce the fluorine contamination present on the wafer surface. In one embodiment of the present invention the process wafer is subjected to a curing treatment at a temperature of between about 200° C. and about 350° C. for a period of time between about 1 hour and about 6 hours.

Turning to FIGS. 3A and 3B, fluorine contamination levels on polyimide surfaces of the semiconductor process wafers according to ESCA (Electron Spectroscopy for chemical Analysis) are compared in FIGS. 3A and 3B where in FIG. 3A chemical analysis shown in Table A reflects no curing treatment. In contrast, the chemical analysis in Table B of FIG. 3B where according to one embodiment of the present invention a curing treatment at about 250° C. for a period of about 1.5 hours was included in the polyimide layer curing treatment process. According to the ESCA analysis shown in Tables A and B of FIGS. 3A and 3B respectively, a large spot size of about 2 mm by about 5 mm was used to examine the polyimide surface. Results are shown where the detector is positioned at two different take off angles (0 and 60 degrees) with respect to the analysis surface of the semiconductor wafer. It can clearly be seen that the fluorine surface concentration is significantly reduced after the curing treatment according to one embodiment of the present invention as shown in Table B in column 301B of FIG. 3B compared to the fluorine surface concentration with no curing treatment as shown in Table A in column 301A. It will be appreciated that the period of time required for the curing treatment to reduce a fluorine contamination level will increase at lower temperatures. Further, it will be appreciated that a fluorine contamination level will be decreased to a relatively lower level, for example following a 1/e relationship with time following a longer curing treatment at a given temperature.

Turning to FIGS. 4A and 4B are shown a graphical representation of a top view of the bonding pads comparing visually apparent bonding pad corrosion defect formation after about 3 months of storage in an ambient sealed environment where the semiconductor wafer surface included a wet scrubbing process (FIG. 4A) and where the semiconductor wafer surface included a curing treatment according to the present invention (FIG. 4B), both following hydrofluorocarbon RIE. Defects e.g., 401 resulting from corrosive segregation of fluorine onto the bonding pad surfaces 403 to form, for example, fluorinated aluminum crystals where no curing treatment according to the present invention is followed. In contrast, FIG. 2B shows a visually clean bonding pad surfaces following a curing treatment according to one embodiment of the polyimide surface curing process according to the present invention where the curing treatment included a temperature soak at about 250° C. for a period of about 1.5 hours following hydrofluorocarbon RIE.

Further, semiconductor wafers subjected to the curing treatment according to the present invention exhibited comparable reliability and quality control results following the RIE process, for example, thermal cycling (TC) and highly accelerated stress testing (HAST). Thus, quality control testing demonstrating that the curing treatment according to the present invention had no undesirable effects with respect semiconductor wafer reliability while demonstrating improved performance over the long term by reducing the corrosion and defect formation on bonding pad surfaces thereby improving bonding performance in for example, a wire bonding or tape bonding operation. It will be appreciated that the bondability of the bonding pad surface is improved for any bonding pad operation where adhesion of one metal to another metal layer is required.

In an exemplary process for carrying out the present invention, for example, automated wafer handling machines that are known in the art may be used. For example a substrate heating means may be added to one of the process chambers in a multi-chamber processing system. For example, a hotplate or infrared means may be used to heat the semiconductor wafer to the curing temperature. For example, according to the present invention, in the curing of the polyimide surface, the semiconductor wafer may be heated to one or more curing temperatures according to a predetermined temperature versus time profile under controlled ambient conditions. For example, a pre-determined vacuum may be selected to be maintained, thus determining a heating rate to one or more preselected temperatures. Alternatively, the temperature heating rate may be the controlling feature regardless of the ambient pressure.

Thus, according to the present invention, a process has been presented whereby fluorine contamination remaining following a reactive ion etching process is removed from a semiconductor wafer surface such that long term effects including segregation onto bonding pad surfaces is avoided thereby increasing the bonding reliability and increasing a yield of packaged semiconductor chips.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for reducing a fluorine contamination level on a semiconductor wafer process surface in a polyimide passivation layer comprising a packaged semiconductor chip comprising the steps of:

providing a semiconductor wafer surface having a process surface including an uppermost polyimide containing layer overlying a metallic bonding pad;

reactive ion etching the process surface to form an opening over and exposing the metallic bonding pad to include exposure of the process surface to a fluorine containing plasma; and, heating the process surface according to a temperature profile following the reactive ion etching step to reduce a fluorine contamination level in the polyimide containing layer thereby reducing fluorine segregation onto the metallic bonding pad surface.

2. The method of claim 1, wherein the temperature profile includes a temperature of from about 200 degrees Centigrade to about 350 degrees Centigrade.

3. The method of claim 2, wherein the temperature profile includes heating time periods of from about 1 hour to about 6 hours.

4. The method of claim 1, wherein the temperature profile includes at least one of a temperature heating rate and a temperature soaking time.

5. The method of claim 1, wherein the step of heating is carried out under controlled ambient conditions.

6. The method of claim 1, wherein the polyimide containing layer comprises a photosensitive polyimide passivation layer overlying at least a first passivation layer formed over the metallic bonding pad surfaces.

7. The method of claim 1, wherein the polyimide containing layer is photolithographically patterned and developed to reveal an underlying passivation layer prior to the step of reactive ion etching.

8. The method of claim 7, wherein the step of reactive ion etching further includes etching through at least the underlying passivation layer to reveal the metallic bonding pad surfaces.

9. The method of claim 7, wherein the metallic bonding pad surfaces comprise a metal selected from the group consisting of aluminum and copper.

10. The method of claim 7, wherein the method further comprises the step of storing the semiconductor wafer under controlled ambient conditions.

11. A method for reducing fluorine contamination on a polyimide surface and subsequent fluorine induced defect formation on an aluminum bonding pad surface to improve subsequent wire bonding comprising the steps of:

provuding a semiconductor wafer surface having a process surface comprising a polyimide containing passivation layer forming an uppermost surface of the process surface;

photolithographically patterning and developing the polyimide containing passivation layer to reveal an underlying passivation layer;

reactive ion etching through at least the underlying passivation layer with at least one of a hydrofluorocarbon and fluorocarbon containing plasma to reveal an aluminum containing bonding pad surface; and, heating the process surface including the polyimide containing passivation layer following the step of reactive ion etching according to a temperature profile to reduce a fluorine contamination level in the polyimide passivation layer to thereby reduce the formation of fluorine induced defects on the aluminum containing bonding pad surface.

12. The method of claim 11, wherein the temperature profile includes a temperature of from about 200 degrees Centigrade to about 350 degrees Centigrade.

13. The method of claim 12, wherein the temperature profile includes heating time periods of from about 1 hour to about 6 hours.

14. The method of claim 13, wherein the temperature profile includes heating at about 250 degrees Centigrade for about 1.5 hours.

15. The method of claim 11, wherein the temperature profile includes at least one of a temperature heating rate and a temperature soaking time.

16. The method of claim 11, wherein the step of heating is carried out under controlled ambient conditions.

17. The method of claim 11, wherein the method further comprises the step of storing the semiconductor wafer under controlled ambient conditions.

18. The method of claim 11, wherein the fluorine contamination level is reduced by at least about 4 percent.

19. The method of claim 11, wherein the fluorine contamination level is reduced to less than about 25%.

20. The method of claim 11, wherein the step of heating is carried out under controlled ambient pressures.

* * * * *